United States Patent [19]

Covert et al.

[11] Patent Number: 5,221,420
[45] Date of Patent: Jun. 22, 1993

[54] ETCHING METHOD FOR INCREASED CIRCUITIZED LINE WIDTH AND UNIFORMITY

[75] Inventors: Kathleen L. Covert, Kirkwood; Jennette E. Kingsley, Vestal, both of N.Y.; David N. Light, Friendsville, Pa.; Richard A. Schumacher, Endicott, N.Y.

[73] Assignee: International Business Machines Corporation, Armonk, N.Y.

[21] Appl. No.: 912,067

[22] Filed: Jul. 8, 1992

Related U.S. Application Data

[63] Continuation of Ser. No. 650,548, Feb. 5, 1991, abandoned.

[51] Int. Cl.⁵ .................................. H01L 21/00
[52] U.S. Cl. ........................ 156/640; 156/650; 156/664
[58] Field of Search ............ 156/636, 640, 650, 651, 156/664

[56] References Cited

U.S. PATENT DOCUMENTS

| | | | |
|---|---|---|---|
| 3,401,068 | 9/1968 | Benton | 156/640 |
| 3,808,067 | 4/1974 | Brown | 156/640 |
| 4,013,498 | 3/1977 | Frantzen et al. | 156/345 |
| 4,482,425 | 11/1984 | Battey | 156/637 |
| 4,917,758 | 4/1990 | Ishizuka et al. | 156/630 |
| 4,966,647 | 10/1990 | Siegmund et al. | 156/640 |
| 4,985,111 | 1/1991 | Ketelhohn | 156/640 |

OTHER PUBLICATIONS

"Handbook of Printed Circuit Manufacturing"; by Raymond H. Clark; ©1985; Van Nostrand Reinhold.
"Printed Circuits Handbook"; by Coombs; ©1979; McGraw-Hill.

Primary Examiner—Brian E. Hearn
Assistant Examiner—George Goudreau
Attorney, Agent, or Firm—Richard M. Goldman

[57] ABSTRACT

Disclosed is a method of fabricating a microelectronic package, especially a microelectronic package having copper circuitization on a dielectric substrate. The method includes depositing copper on opposite surfaces of the package, and then depositing resist atop the copper. The resist is patterned, e.g., by photolithography or screening so that intended circuitization traces are covered by the resist. The exposed copper is etched, and the resist is stripped off of the unexposed copper. The process is characterized in that the etchant is upwardly sprayed onto a downwardly facing first surface of the package for half of the etching cycle, and then the package is rotated so that etchant is upwardly sprayed onto the downwardly facing second surface of the package.

3 Claims, 2 Drawing Sheets

ETCHING METHOD FOR INCREASED CIRCUITIZED LINE WIDTH AND UNIFORMITY

This is a continuation of application Ser. No. 07/650,548, filed on Feb. 5, 1991, now abandoned.

FIELD OF THE INVENTION

The invention relates to the fabrication of microelectronic circuit packages. More particularly the invention relates to two sided microelectronic circuit package layers having circuitization applied to both surfaces thereof.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, New York, (1988), and Rao R. Tummala and Eugene J. Rymaszewski, *Microelectronic Packaging Handbook*, Van Nostrand Reinhold, New York, New York (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

Packages may be characterized by the material used as the dielectric, i.e., as ceramic packages or as polymeric packages. The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334-371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853-922, also previously incorporated herein by reference.

In the normal process for package fabrication a fibrous body, such as a non-woven mat or woven web, is impregnated with a resin. This step includes coating the fibrous body with, for example, an epoxy resin solution, evaporating the solvents associated with the resin, and partially curing the resin. The partially cured resin is called a B-stage resin. The body of fibrous material and B stage resin is called a prepreg. The prepreg, which is easily handled and stable, may be cut into sheets for subsequent processing.

Subsequent processing of polymeric substrates includes circuitization, that is, the formation of a Cu signal pattern or power pattern on the prepreg, or lamination of the prepreg to a power core. Circuitization may be additive or subtractive.

Subtractive circuitization is described, for example in Gerald W. Jones, Jane M. Shaw, and Donald E. Barr, *Lithography In Electronic Circuit Packaging*, in Chapter 12 of Seraphim et al., *Principles of Electronic Packaging*, pages 372-423. As described therein, copper is applied to the substrate. This copper generally has a thickness of at least about 1.4 mils (one ounce per square foot). Thereafter a resist is placed on the copper coated printed circuit board substrate to define the printed circuit on circuitization. After, e.g., exposure and development, the resist covers the copper in areas that are to become circuit traces, and leaves the rest of the copper exposed.

The board, with patterned resist atop the copper, is passed through an etching chamber containing copper etchants. These etchants convert the copper to water soluble copper compounds and complexes which are removed by spray action.

The copper that was underneath the resist is only minimally attacked by the etchants, with some undercut. After etching the resist is stripped, that is, chemically debonded and mechanically removed, leaving behind copper in the form of the desired circuit traces.

The composite printed circuit package is fabricated by interleaving cores (including signal cores, signal/signal cores, power cores, power/power cores, and signal/power cores) with additional sheets of prepreg, and surface circuitization. Holes, as vias and through holes, may be drilled in individual core structures, for example, before or after circuitization, as described above, or in partially laminated modules.

Composite circuit structures, that is, multi-layer packages, are panel plated to cover the surface and through hole interconnections with copper. These composite structures are subsequently subtractively circuitized using lithographic etching processes described above. In this case, the surface copper thickness is typically 50 microns or greater.

One problem that has been observed with the above described "full panel plating" and "subtractive etching" process is the uniformity of line width of the circuit leads. It must be emphasized that linewidth nonuniformity causes impedance nonuniformity, result in deleterious electromagnetic effects between lines on the same layer as well as between layers, "stubs", and reflections. These all reduce signal integrity.

In the full panel plating—subtractive etching process, line width uniformity goes down with increasing panel size. This is true with both large single unit panels and still larger multi-unit panels. The large multi-unit panels are fabricated and circuitized as a single panel, and then broken up into multiple units. The problem is most severe in high circuit density, high tolerance, narrow line packages.

OBJECTS OF THE INVENTION

It is one object of the invention to provide high density cards and boards.

It is another object of the invention to obtain packages, units, and panels having high uniformity, and fine lines on a narrow pitch.

It is a further objective of the invention to obtain line width uniformity on both sides of a fully circuitized unit.

SUMMARY OF THE INVENTION

These and other objects are obtained by the microelectronic circuit package fabrication method of the invention. The fabrication method is useful for fabricating a microelectronic package having copper surface circuitization on both surfaces of the package.

The method of the invention is a subtractive circuitization process that includes depositing copper on opposite surfaces of the package, and then depositing resist atop the both copper surfaces. The resist is resistant to the etchant solutions used to pattern the copper. The resist is patterned, for example, by photolithography or screening, so that intended circuitization traces are covered by the resist. The exposed copper is etched. After etching the exposed copper the resist is stripped off of the unexposed copper.

The process is characterized in that the etchant is upwardly sprayed onto a downwardly facing first surface of the package for half of the etching cycle, and then the package is rotated so that etchant is upwardly sprayed onto the downwardly facing second surface of the package.

In practicing the method of the invention the panel may be a multi-package panel. When the panel is a multi-unit panel, the process further includes the step of dividing the panel into individual packages.

BRIEF DESCRIPTION OF THE DRAWING FIGURES

The invention may be understood by reference to the Figures.

DETAILED DESCRIPTION OF THE INVENTION

According to the method of the invention a microelectronic circuit package is fabricated having copper circuitization on both surfaces of a dielectric substrate.

Figure 1:
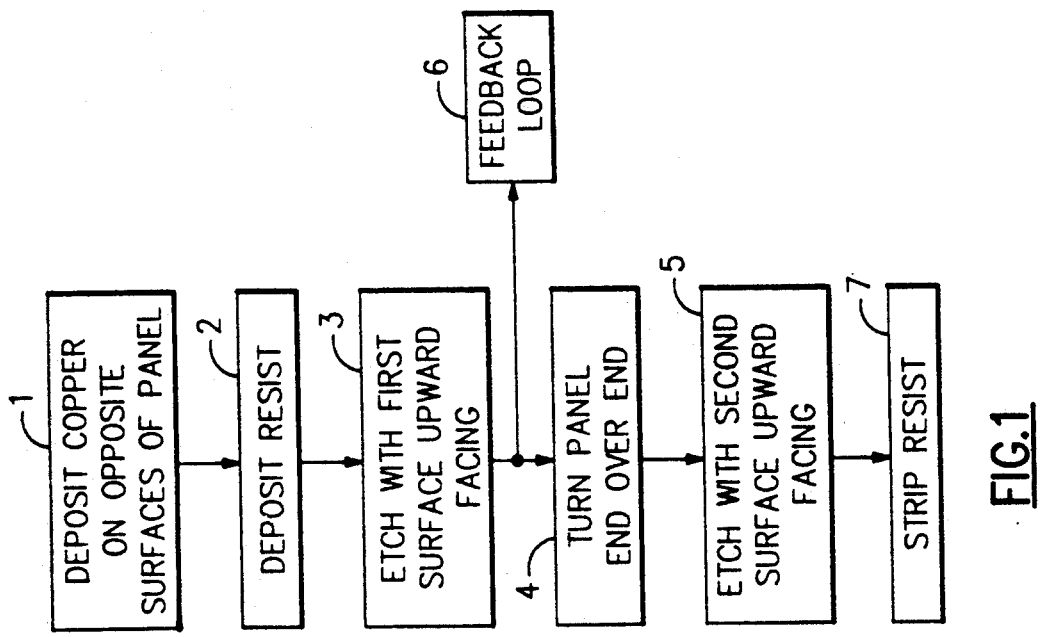
FIG. 1 is a flow chart of the method of the invention.

A flow chart of this invention is shown in FIG. 1. The method includes the preliminary steps of depositing copper on opposite surfaces of the microelectronic circuit package panel, as shown in block 1 of the flow chart, and then depositing resist atop the copper, as shown in block 2 of the flow chart. Copper deposition may be preceded by pretreatment of the substrate, and alternatively or additionally by the deposition of an adherence or adhesion layer, as a polymeric layer or a chromium layer. The copper may be deposited as a foil, by sputtering, or by electroless or electrolytic deposition, or a combination or sequence thereof.

The resist is deposited atop the copper and patterned, for example, by photolithography or screening. In this way the intended circuitization traces are covered by the resist, and the copper intended to be removed is exposed. The exposed copper is etched, as shown in blocks 3, 4, and 5.

The process is characterized in that the etchant is upwardly sprayed onto a downwardly facing first surface of the package for half of the etching cycle, block 3, and then the package is rotated, i.e., turned end over end, block 4, so that etchant is upwardly sprayed onto the downwardly facing second surface of the package, block 5. This cycle may be repeated several times, as represented by feed back loop 6.

It is, of course, to be noted that etcher materials of construction may require panel rinsing between passes or steps.

After etching the exposed copper the resist is stripped off of the unexposed copper, block 7, leaving circuit traces of high line width uniformity.

Highly uniform circuit traces are required as circuit traces become narrower and closer together. As circuit densities of microelectronic circuit packages have increased, with more circuits and leads per package, and more lines per unit area, line widths and pitches have grown ever narrower. This has necessitated increased uniformity of line widths and line spacings. In this regard conventional, state of the art, subtractive circuitization, while generally an attractive process, produces line widths which are not uniform enough for high performance (high circuit density, high clock rate) packages. For example, a 50 micron thick micron thick copper surface, comprised of 33 micron of plated copper on 17 micron of copper foil, on a 19.5 inch by 24 inch (0.5 meter by 0.6 meter) panel area, and containing areas of different circuit densities, with active circuitry extending close to the edges of the panel, might be circuitized with 5 mil lines having a uniformity such that 3 standard deviations equals 1.75 mils or greater. This variation in linewidth is wholly unsatisfactory for for a high performance package. It can give rise to uneven impedance and reflections, reducing signal integrity.

In investigating the causes of this non-uniformity, the inventors of the instant method have observed that a panel goes through the etching process with one surface facing upward throughout the entire etching process and the other surface facing downward throughout the entire etching process. They have also found that a significant portion of the line width non-uniformity occurs on the upward facing surface of the panel, with the line widths on the upward facing surface of the panel having a standard deviation of 0.5 to 0.7 mils, while the downward facing surface of the panels having a standard deviation of 0.2 to 0.4 mils for the type of panel herein described. This is a significant difference in a significant measure of uniformity.

Figure 2:
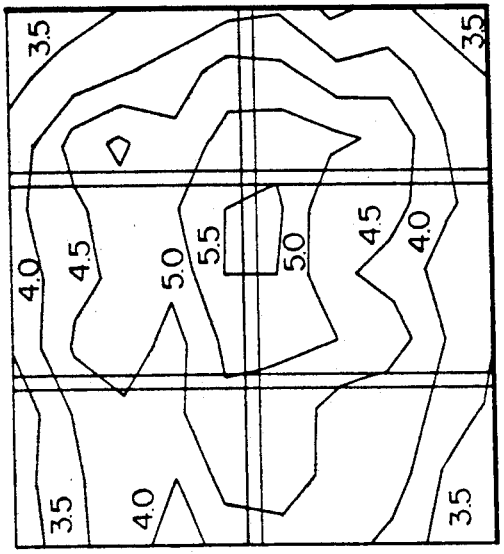
FIG. 2 is a map of mean line width as a function of position on the normally upward facing surface (top) of the panel.

The inventors of the present invention have also found that there is a gradient of line widths from the center of the upward facing surface (top) of the panel to the edge of the upward facing panel. This gradient is shown in FIG. 2, which is a mapping of the line across the upward facing surface of a large (19.5 inches by 24 inches, 0.5 meter by 0.6 meter) panel with a copper thickness of 50 to 55 microns. This mapping shows a circular distribution of line widths, with the widest lines near the center, and the narrowest lines near the edges, especially at the corners.

Figure 3:
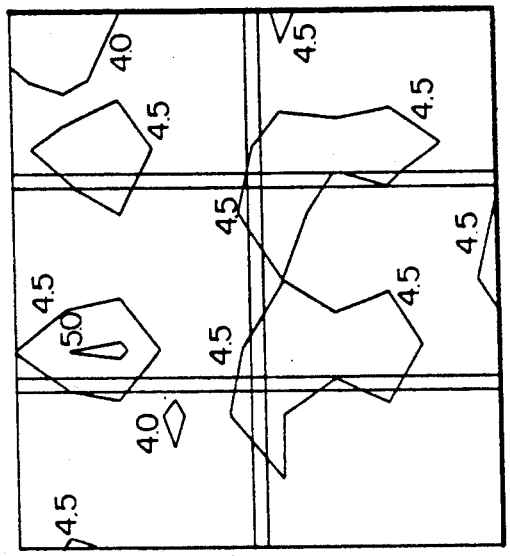
FIG. 3 is a map of mean line width as a function of position on the normally downwardly facing surface (bottom) of the panel.

The inventors of the present invention have further found that the line widths on the downward facing surface (bottom) of the panel show a more uniform distribution. This mapping is shown in FIG. 3, and the inventors herein have found that the distribution of line widths reflects differences in copper thickness across the bottom of the panel, with no center to edge gradient in line width. This is clearly contrary to what the inventors have observed on the top of the panel.

The inventors have developed an etch process which leads to improved line width uniformity. The process utilizes a multi-step etch process, with end for end turning of the panel at each step. In a preferred embodiment, this process is a single pass resist process, followed by a two pass etch process. According to the method of the invention the panels are resist laminated and the resist patterned normally, that is, by screening or by lithography, with circuitry on both surfaces of the panel. The resist is then developed normally.

The panel is then etched in the etch chamber at approximately the same etch residence time as in a normal process, but with the first surface downward facing and the second surface upward facing for approximately one half of the etch residence time, and with the second surface downward facing and the first surface upward facing for approximately one half of the etch residence time. That is, the first surface is downward facing for approximately one half of the etch residence time, and upward facing for approximately one half of the residence time.

This may be accomplished by various expedients. Thus, according to one embodiment the panel is etched in one orientation for half of the residence time, and then turned end over end and etched in the opposite orientation for the other half of the etch time. Alternatively, the panel may be turned end over end several times during the etch process.

In a two pass embodiment the panel is run through the etch chamber at an accelerated speed with respect to a normal single pass etching system, for example, at twice the normal speed. The panel is then turned end over end and passed through the etch chamber at twice the normal speed.

Figure 4:
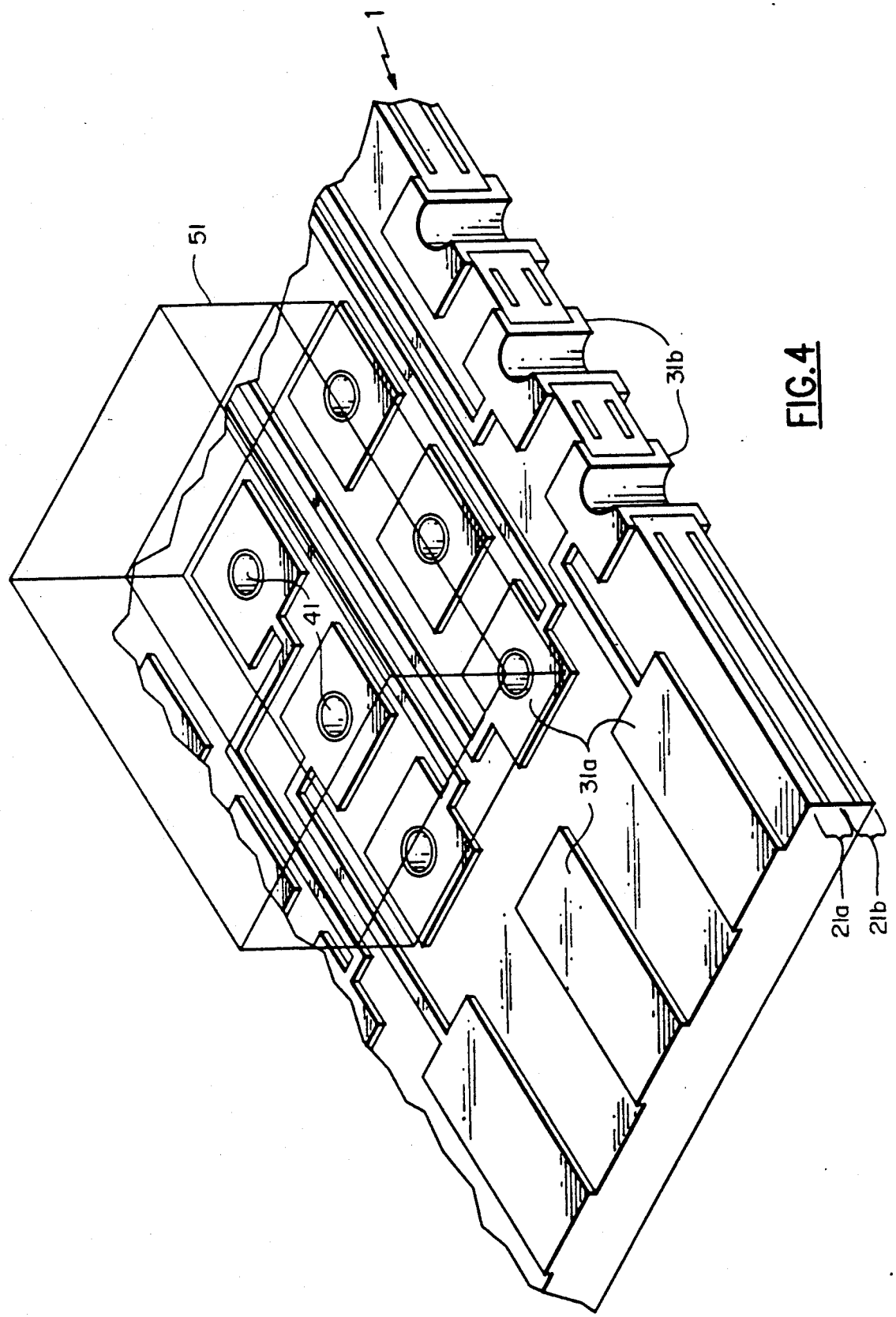
FIG. 4 is a partial cutaway view of a microelectronic circuit package produced according to the method of the invention.

A microelectronic circuit package prepared by a method of the invention is shown in FIG. 4. The circuit package 1 has a pair of polymeric layers 21a, 21b. The polymeric layers carry surface circuitization 31a, 31b on the opposite polymeric layers 21a, 21b, including through holes 41 and at least one integrated circuit chip 51.

The method of the invention may be further understood by the reference to the Examples.

EXAMPLES

Example 1

A series of tests were run in a Hollmuller ® etcher to determine the line width means and standard deviation as a function of surface orientation. In each experiment a 19.5 inch by 24 inch substrate was coated with 2 ounce per square foot Cu on each surface, followed by 2 mil DuPont Riston ® resist. The photoresist was developed, and the exposed copper etched. Two panels were etched in a single pass, with the top side up, and two panels were etched in a double pass, with the top side up for the first pass and down for the second pass. The etch parameters were as shown in Table 1—1.

TABLE 1-1

| Etch Parameters | |
|---|---|
| Etch Temperature | 53° C. |
| HCl Concentration | 2.8 Normal |
| Spray Pressure | |
| Top | 35 psi (time average) |
| Bottom | 16 psi |
| Redox Potential | 478 mV (vs Ag/AgCl) |
| Conveyor Speed | |
| Single pass | 0.94 meters/min |
| Double pass | 1.89 meters per minute |
| Orientation | 24" edge leading |

The results shown in Table 1-2 were obtained.

TABLE 1-2

| | Line Parameters | |
|---|---|---|
| | Mean Linewidth | Standard Deviation Linewidth |
| Single Pass | | |
| Front | 4.21 mils | 0.587 mils |
| Back | 4.51 mils | 0.384 mils |
| Overall | 4.36 mils | 0.518 mils |
| Double Pass | | |
| Front | 4.43 mils | 0.353 mils |
| Back | 4.48 mils | 0.379 mils |
| Overall | 4.46 mils | 0.366 mils |

Example 2

A series of tests were run in a Hollmuller ® etcher to determine the line width means and standard deviation as a function of surface orientation. In each experiment a 19.5 inch by 24 inch substrate was coated with 2 ounce per square foot Cu on each surface, followed by 2 mils of DuPont Riston ® resist. The photoresist was developed, and the exposed copper etched. Nine panels were etched in a single pass, with the top side up, and seven panels were etched in a double pass process, with the top side up for the first pass and down for the second pass. The etch parameters were as shown in Table 2-1.

TABLE 2-1

| Etch Parameters | |
|---|---|
| Etch Temperature | 53° C. |
| HCl Concentration | 3.0 Normal |
| Spray Pressure | |
| Top | 35 psi (time average) |
| Bottom | 16.7 psi |
| Redox Potential | 480 mV (vs Ag/AgCl) |
| Conveyor Speed | |
| Single pass | 1.06 meters/min |
| Double pass | 2.20 meters per minute |
| Orientation | 24" edge leading |

The results shown in Table 2—2 and plotted in FIGS. 2 and 3 were obtained.

TABLE 2-2

| | Line Parameters | |
|---|---|---|
| | Mean Linewidth | Standard Deviation Linewidth |
| Single Pass | | |
| Front | 3.93 mils | 0.627 mils |
| Back | 4.25 mils | 0.332 mils |
| Overall | 4.09 mils | 0.526 mils |
| Double Pass | | |
| Front | 4.16 mils | 0.377 mils |
| Back | 4.21 mils | 0.321 mils |
| Overall | 4.19 mils | 0.351 mils |

Examples 1 and 2 show that the method of the invention results in the means and standard deviations of the two surfaces of the panels being closer together, as well as a significant reduction in the standard deviation of the line width for the top surface of the panel. There is also a greater uniformity between the two surfaces. To be noted is that there is no decrease in quality of the "back" or bottom surface as a result of the multiple pass method of the invention. That is, the mean linewidth and the standard deviation of the linewidth of the "bottom" surface not only did not increase, but actually decreased. Moreover, the "top" surface linewidth standard deviation actually decreased markedly in both examples.

An additional advantage of the invention is that the mean linewidth on the two sides of the panel are more easily made equivalent than in the case of conventional etching. This is because both sides of the panel see hydrodynamically equivalent conditions, with upward and downward facing sprays of the etching tool. Any differences between the upward and downward facing sprays will be averaged out over the process. The same is true of "plugged" nozzles, intermittent pump problems, etc. which might otherwise have a more significant impact on linewidth uniformity.

While the invention has been described with respect to certain preferred embodiments and exemplifications, it is not intended to limit the scope of the invention thereby, but solely by the claims appended hereto.

We claim:

1. In a method of fabricating a microelectronic circuit package panel having circuitization on opposite surfaces thereof, comprising depositing copper on opposite surfaces of the package, depositing and patterning resist atop the copper on both surfaces of the package whereby intended circuitization traces on both surfaces of the package are covered by the resist, simultaneously etching exposed copper on both surfaces of the package, and thereafter stripping the resist off of the unexposed copper on both surfaces of the package, the improvement comprising:
   a. simultaneously (1) upwardly spraying etchant onto a downwardly facing first surface of the package and (2) downwardly spraying etchant onto an upwardly facing second surface of the package, and
   b. thereafter rotating the package and simultaneously (1) downwardly spraying etchant onto the upwardly facing first surface of the package and (2) upwardly spraying etchant onto the downwardly facing second surface of the package.

2. The method of claim 1 wherein the residence time of stagnant puddles formed on an upward facing surface of the panel is insufficient to cause non-uniformity of linewidth.

3. In a method of fabricating a microelectronic circuit multi-package panel having circuitization on opposite surfaces thereof, comprising depositing copper on opposite surfaces of the package, depositing and patterning resist atop the copper on both surfaces of the package whereby intended circuitization traces on both surfaces of the package are covered by the resist, simultaneously etching exposed copper on both surfaces of the package, and thereafter stripping the resist off of the unexposed copper on both surfaces of the package, the improvement comprising:
   a. simultaneously (1) upwardly spraying etchant onto a downwardly facing first surface of the package and (2) downwardly spraying etchant onto an upwardly facing second surface of the package at an etching residence time insufficient to allow stagnant puddles formed on the upward facing second surface of the panel to cause non-uniformity of linewidth;
   b. rotating the package;
   c. thereafter simultaneously (1) downwardly spraying etchant onto the upwardly facing first surface of the package and (2) upwardly spraying etchant onto the downwardly facing second surface of the package at an etching residence time insufficient to allow stagnant puddles formed on the upward facing first surface of the panel to cause non-uniformity of linewidth;
   d. thereafter dividing the panel into individual packages.

* * * * *